United States Patent
Iwashita et al.

(10) Patent No.: US 6,849,861 B2
(45) Date of Patent: Feb. 1, 2005

(54) ELECTRONIC DEVICE AND ELECTRONIC APPARATUS

(75) Inventors: Setsuya Iwashita, Suwa (JP); Takamitsu Higuchi, Suwa (JP); Hiromu Miyazawa, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/108,180

(22) Filed: Mar. 27, 2002

(65) Prior Publication Data

US 2002/0149019 A1 Oct. 17, 2002

(30) Foreign Application Priority Data

| Mar. 28, 2001 | (JP) | 2001-093924 |
| Mar. 19, 2002 | (JP) | 2002-076695 |
| Mar. 26, 2002 | (JP) | 2002-085812 |

(51) Int. Cl.$^7$ .......................................... H01L 29/06
(52) U.S. Cl. .......................... 257/13; 257/79; 257/103; 257/918; 438/22; 438/24; 438/46; 438/257
(58) Field of Search .......................... 257/13, 79–103, 257/918; 438/22, 24, 25, 28, 29, 46, 47, 257

(56) References Cited

U.S. PATENT DOCUMENTS

| 5,155,566 | A | * | 10/1992 | Nakayama et al. ............ 257/40 |
| 5,274,249 | A | * | 12/1993 | Xi et al. ...................... 505/191 |
| 5,834,803 | A | * | 11/1998 | Nashimoto ................... 257/295 |
| 5,912,068 | A | * | 6/1999 | Jia .............................. 428/210 |
| 6,015,990 | A | * | 1/2000 | Hieda et al. ................. 257/310 |
| 6,069,368 | A | * | 5/2000 | Wilk et al. ..................... 257/25 |
| 6,078,717 | A | * | 6/2000 | Nashimoto et al. .......... 385/130 |
| 6,111,284 | A | * | 8/2000 | Sakurai ....................... 257/310 |
| 6,278,138 | B1 | * | 8/2001 | Suzuki ........................ 257/103 |
| 6,461,737 | B2 | * | 10/2002 | Migita et al. ................. 428/446 |
| 6,470,125 | B1 | * | 10/2002 | Nashimoto et al. .......... 385/122 |
| 6,493,497 | B1 | * | 12/2002 | Ramdani et al. ............. 385/131 |
| 6,497,763 | B2 | * | 12/2002 | Kub et al. ...................... 117/94 |
| 6,538,359 | B1 | * | 3/2003 | Hiraku et al. ............ 310/313 R |

FOREIGN PATENT DOCUMENTS

| JP | 8-330540 | 12/1996 |
| JP | 9-100125 | 4/1997 |
| JP | 2000-278084 | 10/2000 |

OTHER PUBLICATIONS

I, Kanno, S. Fujii, T. Kamada, and R. Takayama, Piezoelectric properties of c–axis oriented Pb(Zr,Ti)O3 thin films, American Institute of Physics, Appl. Phys. Lett. 70(11) (pp. 1378–1380), Mar. 17, 1997.

* cited by examiner

Primary Examiner—David Nelms
Assistant Examiner—Long Tran
(74) Attorney, Agent, or Firm—Harness, Dickey & Pierce, P.L.C.

(57) ABSTRACT

Performance of an electronic device is highly improved by epitaxially growing a perovskite-type oxide thin film on an inorganic amorphous layer or an organic solid layer in a desired direction; and furthermore, a high performance electronic device is provided by incorporating the electronic device into an integrated circuit, wherein oxide thin layers are formed on the inorganic amorphous layer or the organic solid layer, and the perovskite-type oxide thin film is grown epitaxially on the oxide layer, the oxide thin layers being able to be at least one of strontium oxide, magnesium oxide, cerium oxide, zirconium oxide, yttrium stabilized zirconium oxide, and strontium titanate; and as the perovskite-type oxide thin film, the perovskite-type oxide thin film being a piezoelectric or ferroelectric material, for example, is used.

20 Claims, 4 Drawing Sheets

ELECTRONIC DEVICE AND ELECTRONIC APPARATUS

BACKGROUND OF THE INVENTION

1. Field of the Invention

The present invention relates to an electronic device, especially, a ferroelectric device, a surface acoustic device, and a piezoelectric device, based on a perovskite-type oxide thin film grown epitaxially on an oxide thin layer on an inorganic amorphous layer or an organic solid layer, and an electronic apparatus comprising the electronic device.

2. Description of the Related Art

Conventionally, when a perovskite-type oxide thin film is grown epitaxially, a single crystal substrate or a crystallized buffer layer is chosen by considering lattice matching with a perovskite-type oxide to be grown epitaxially. For example, for a surface acoustic device using a perovskite-type oxide thin film, as described in Japanese Unexamined Patent Application, First Publication No. Hei 2000-278084, good properties have been obtained by growing a potassium niobate (described as "$KNbO_3$" hereafter) thin film having a high electromechanical coupling factor (described as "$k^2$" hereafter) on a single crystal substrate of strontium titanate (described as "$SrTiO_3$" hereafter) with (110) orientation epitaxially. Also, as described in Japanese Unexamined Patent Application, First Publication No. Hei 9-100125, an example is presented of obtaining a $KNbO_3$ film with (110) orientation on an amorphous substrate.

On the other hand, for a piezoelectric device such as a ferroelectric memory device or an actuator, as described in Japanese Unexamined Patent Application, First Publication No. Hei 8-330540 or Japanese Applied Physics Lett, 70, 1378–1380 (1997), attempts have been made to fabricate a device by using a thin film grown epitaxially or grown with an orientation on a crystal substrate in order to improve their properties.

Generally, a polarization direction is determined by a material, so that an epitaxial film with a controlled polarization direction is preferable in order to control device characteristics. Also, an epitaxial film is advantageous for reducing the effects of grain boundaries on the device characteristics. Furthermore, an ultra-thin film will be required for a ferroelectric memory element or a ferroelectric memory device having a ferroelectric memory cell array, which is an assembly of ferroelectric memory elements. From this viewpoint, an epitaxial film is also advantageous in order to reduce leakage current or to improve a square-loop characteristic A mere oriented film is inferior to an epitaxial film in these points. In an oriented film, packing density is tower than that in an epitaxial film, in-plane orientation is not as uniform, and crystallization is not as fully controlled. Consequently, in recent years, an epitaxial film of a perovskite-type oxide is receiving serious attention for fabricating devices.

Conventional technologies for growing perovskite-type oxide thin films epitaxially have problems described below.

First, as described above, when a perovskite-type oxide thin film is grown epitaxially, a single crystal substrate or a crystallized buffer layer having a lattice matching with a perovskite-type oxide must be used.

Even though oxide ceramics such as $SrTiO_3$ are normally used as a single crystal substrate, the cost of oxide ceramic substrates is generally high, and fabrication of large substrates of 3 inches or more in diameter is difficult depending on the types. On the other hand, as described in Japanese Unexamined Patent Application, First Publication No, Hei 8-330540, examples are shown of epitaxially growing a perovskite-type oxide thin film via a buffer layer crystallized on a silicon substrate, which is inexpensive and suitable for large diameters. However, when a capacity increase or a miniaturization is attempted by integrating a ferroelectric memory device or surface acoustic device on a semiconductor device, usually, these must be formed on a silicon oxide amorphous interlayer insulating film of the semiconductor device; therefore, a technology to grow a perovskite-type oxide thin film epitaxially on an amorphous layer is required.

Even though a technology to grow a perovskite-type oxide thin film epitaxially on a silicon substrate is highly valuable in terms of cost and other factors, the technology alone cannot accomplish the desired integration with semiconductor devices. Also, when a piezoelectric device such as an actuator is fabricated, a perovskite-type oxide thin film must be formed on a thermally oxidized film of a silicon oxide as well, so that a technology to form a perovskite-type oxide thin film on a silicon substrate alone is not sufficient. There are examples of forming perovskite-type oxide thin films on a crystallized film of platinum or the like formed on an amorphous silicon oxide film; however, even though oriented films can be obtained in such cases, epitaxial films cannot be obtained.

As described above, an epitaxial film is superior to an oriented film for device performance. Therefore, if a perovskite-type oxide thin film could be formed on an amorphous layer, integration with a semiconductor device would become possible and not only could a high performance device be built, but a perovskite-type oxide thin film could be grown epitaxially on any substrate regardless of whether or not the substrate is crystal, thereby expanding the application range enormously. That is, any substrate could be used as long as it can withstand a temperature for forming a perovskite-type oxide thin film.

As described in Japanese Unexamined Patent Application, First Publication No. 9-100125, there is an example of forming $KNbO_3$ on an amorphous substrate; however, what is obtained is an oriented film, and obtaining an epitaxial film is still difficult. It is difficult, furthermore, to grow a crystal in a desired orientation direction.

SUMMARY OF THE INVENTION

Objects of the present invention are: to solve the problems described above; to provide an electronic device having a perovskite-type oxide thin film grown epitaxially in a desired direction on an inorganic amorphous layer or an organic solid layer; and additionally, to provide an electric apparatus comprising the electronic device.

The present invention provides an electronic device having an inorganic amorphous layer or an organic solid layer; an oxide thin layer formed on the inorganic amorphous layer or the organic solid layer; and a perovskite-type oxide thin film grown epitaxially on the oxide thin layer.

With the configuration described above, by using any substrate having an inorganic amorphous layer or an organic solid layer, an electronic device can be provided having a perovskite-type oxide thin film grown epitaxially on the layer in a desired direction. Furthermore, a high performance electronic device can be provided by incorporating the electronic device into an integrated circuit. Furthermore, an electronic apparatus comprising any of the above electronic devices can be provided.

Silicon oxide (described as SiO$_2$ hereafter), aluminum nitride (described as AlN hereafter), glass, amorphous silicon or the like can be used for the inorganic amorphous layer. Among these, the use of SiO$_2$ is preferable because, in many cases, an electronic device of the present invention is formed on a silicon substrate, on which SiO$_2$ is easily formed, or it is often already formed thereon.

Thermosetting resins such as urea resins, melamine resins, phenolic resins, polyimides or the like; or thermoplastic resins such as polyesters (for example, polyethylene terephthalate), polyamides, rigid polyvinyl chlorides, polystyrenes or the like can be used as the organic solid layer.

It is preferable that the oxide thin layer comprise at least one of strontium oxide (described as "SrO" hereafter), magnesium oxide (described as "MgO" hereafter), cerium oxide (described as "CeO$_2$" hereafter), zirconium oxide (described as "ZrO$_2$" hereafter), yttrium stabilized zirconium oxide (described as "YSZ" hereafter), barium oxide (described as "BaO" hereafter), and calcium oxide (described as "CaO" hereafter). These oxide materials permit a high quality perovskite-type oxide thin film to be formed thereon.

The perovskite-type oxide thin film can comprise KNbO$_3$, barium titanate (described as "BaTiO$_3$" hereafter), PZT, SrBi$_2$Ta$_2$O$_9$, Bi$_4$Ti$_3$O$_{12}$, strontium ruthenate oxide (described as "SrRuO$_3$" hereafter), or SrTiO$_3$ or the like. It is preferable that these have piezoelectric, ferroelectric or electrically conductive characteristics, and that they exhibit characteristics as an interlayer to form a layer having piezoelectric, ferroelectric, or electrically conductive characteristics. For example, SrTiO$_3$ can form an interlayer on which a layer having piezoelectric, ferroelectric, or electrically conductive characteristics is formed.

In particular, the present invention provides an electronic device wherein the perovskite-type oxide thin film exhibits piezoelectric characteristics.

Furthermore, an electronic device of the present invention includes a piezoelectric device, a surface acoustic device, a surface acoustic wave oscillator, a ferroelectric memory element, a ferroelectric memory device having a ferroelectric memory cell array and the like.

Furthermore, the present invention also provides an electronic device comprising the above electronic device.

According to the present invention, by including a suitable inorganic amorphous layer or an organic solid layer, as well as an oxide thin layer formed on the inorganic amorphous layer or the organic solid layer, and furthermore, by including a perovskite-type oxide thin film grown epitaxially on the oxide thin layer, and by using a suitable substrate including an inorganic amorphous layer or an organic layer, it is possible to provide an electronic device having a perovskite-type oxide thin film grown epitaxially in a desired direction on the inorganic amorphous layer or the organic solid layer. Furthermore, a high performance electronic device such as a surface acoustic device, a ferroelectric memory device, or a piezoelectric device can be provided by further incorporating such a device into an integrated circuit. Further, according to the present invention, a high performance electronic apparatus comprising any of the above electronic devices is provided.

DESCRIPTION OF THE PREFERRED EMBODIMENTS

The hereinafter described embodiments 1 to 4 are examples of the electronic devices according to the present invention, and the hereinafter described embodiments 5 to 7 are examples of the electronic apparatuses according to the present invention.

(Embodiment 1)

Figure 1:
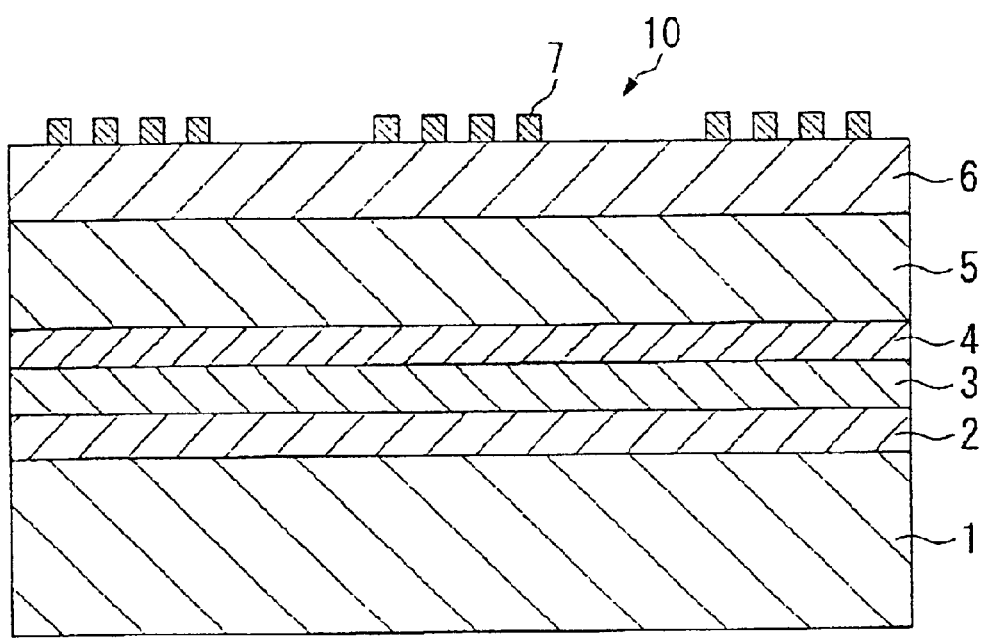
FIG. 1 is a cross sectional view of a surface acoustic device in Embodiment 1 of the present invention.

FIG. 1 is a cross sectional view of a surface acoustic device 10 in Embodiment 1 of the present invention. This device comprises a substrate 1, an inorganic amorphous layer 2 formed on the substrate 1, an oxide thin layer 3 formed on the inorganic amorphous layer 2, a perovskite-type oxide layer 4 grown epitaxially on the oxide thin layer 3, a piezoelectric thin film 5 of a perovskite-type oxide layer grown epitaxially on the perovskite oxide layer 4, a thin film 6 comprised of an oxide or a nitride as a protective layer formed on the piezoelectric thin film 5, and an electrode 7 formed on the thin film 6 as a protective layer.

The substrate 1 can comprise a single silicon crystal, a silicon single crystal having a polycrystalline diamond thin film formed on the silicon or the like.

The amorphous layer 2 can comprise SiO$_2$, AlN or the like. It is preferable that the thickness of each amorphous layer be 5 to 50 nm in order to utilize high sound velocity through the substrate. These amorphous layers can be formed by a method such as a laser ablation method, a CVD method or the like. For example, when SiO$_2$ is formed by a laser ablation method, the oxygen partial pressure is set to 1.3 Pa ($1 \times 10^{-2}$ Torr) and the substrate temperature is set between room temperature (20° C.) and 300° C. When forming AlN, N$_2$ is used.

The oxide thin layer 3 can be formed by SrO, MgO, CeO$_2$, ZrO$_2$, YSZ, BaO, CaO or the like. It is preferable that the thickness of the oxide thin layer 3 be 1 to 50 nm, because obtaining good epitaxial growth is difficult with a value of less than 1 nm. On the other hand, a thickness of more than 50 nm is not necessary since it is only required that a perovskite-type oxide layer 4 be grown epitaxially on an oxide thin film. The range of 1 to 5 nm is more preferable.

These oxide thin layers can be formed by a method such as a laser ablation method, or the like. For example, when SrO is formed by a laser ablation method, the oxygen partial pressure is set to $1.3 \times 10^{-4}$ Pa ($1 \times 10^{-6}$ Torr) and the substrate temperature is set to 200° C. while assisting the film formation by an ion beam.

The oxide thin layer 4 can be formed by SrTiO$_3$, SrRuO$_3$ or the like. It is preferable that the thickness of the oxide thin layer 4 be not less than 1 nm, because obtaining good epitaxial growth is difficult with a value of less than 1 nm.

This perovskite-type oxide thin film 4 is obtained by growing it epitaxially, and can be formed by a method such as a laser ablation method or the like. For example, the perovskite-type thin film can be formed by a laser ablation method with an oxygen partial pressure of 1.3 Pa ($1\times10^{-2}$ Torr) and a substrate temperature of 500 to 650° C.

The piezoelectric thin film 5 of a perovskite-type oxide layer can be formed by $KNbO_3$, PZT, $BaTiO_3$, or the like. It is preferable that the thickness of the piezoelectric thin film of the perovskite-type oxide layers be 1 μm or more, because a high electromechanical coupling factor can be obtained.

The piezoelectric thin film of a perovskite-type oxide layer is obtained by epitaxially growing the same, and can be formed by a laser ablation method, a CVD method, sol-gel method or the like. For example, when forming a $KNbO_3$ thin film by a laser ablation method, a substrate temperature of 500 to 650° C. and an oxygen partial pressure of 1.3 Pa ($1\times10^{-2}$ Torr) are applicable.

The thin film 6 of an oxide or a nitride as a protective layer can comprise $SiO_2$, AlN or the like. These thin films of oxides or nitrides as protective layers can be formed by a method such as a laser ablation method, a CVD method or the like. For example, when forming $SiO_2$ by a laser ablation method, the oxygen partial pressure is set to 1.3 Pa ($1\times10^{-2}$ Torr) and the substrate temperature is set between room temperature (20° C.) and 300° C. When AlN is formed, $N_2$ is utilized.

The electrode 7 can comprise aluminum, copper, Al—Cu—Si alloy or the like. These electrodes can be formed by a method such as a sputtering method, an evaporation method, or the like.

(Embodiment 2)

Figure 2:
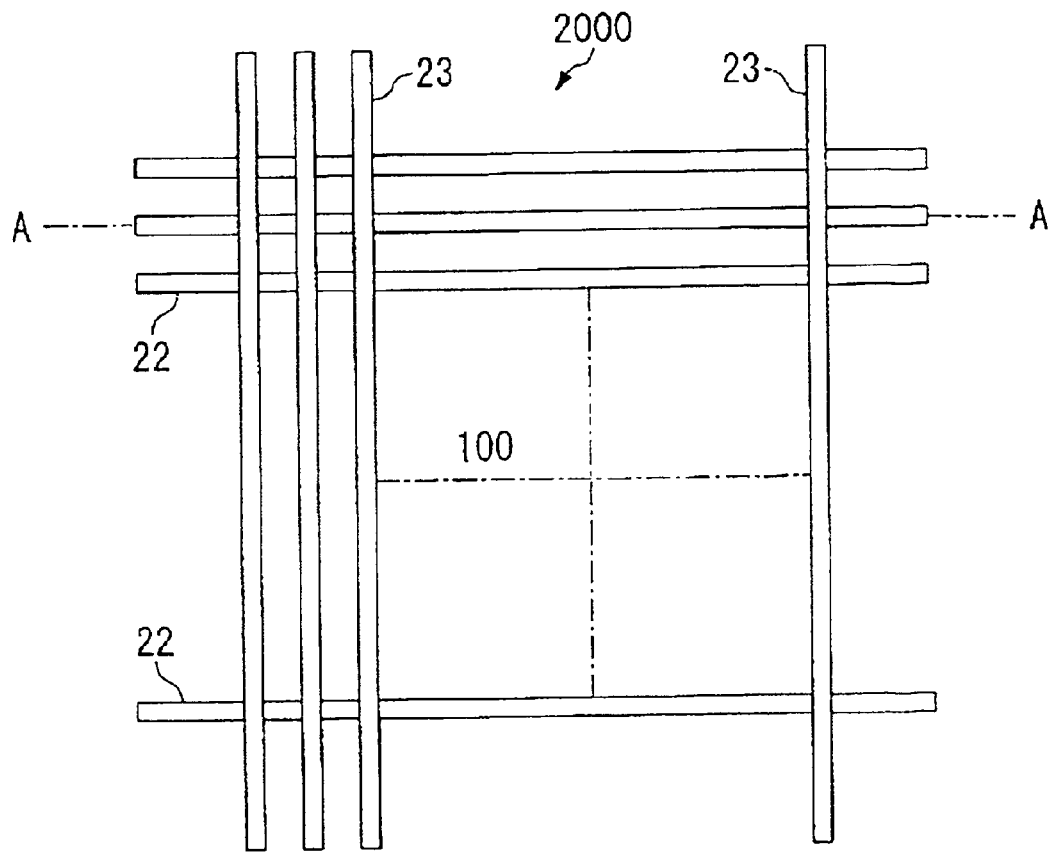
FIG. 2 is a schematic plan view of a ferroelectric memory device in Embodiment 2 of the present invention.
Figure 3:
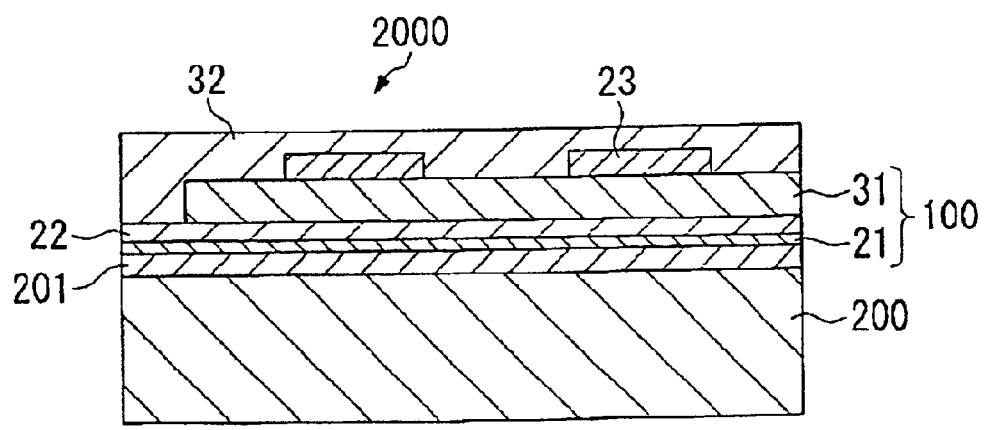
FIG. 3 is a schematic cross sectional view of the portion along A—A in FIG. 2.

FIG. 2 is a schematic plan view of a ferroelectric memory apparatus 2000 in Embodiment 2 of the present invention. FIG. 3 is a schematic cross sectional view of the portion along A—A of FIG. 2.

In these drawings, reference numeral 100 refers to a matrix type memory cell array, and reference numeral 200 refers to a peripheral circuitry containing MOS transistors for selecting a memory cell. The top end of the peripheral circuitry 200 is an amorphous layer 201 of an interlayer insulating film acting as a protective layer at the same time. The reference numeral 21 refers to an oxide thin layer; reference numeral 22 refers to a first signal electrode of a perovskite-type oxide thin film grown epitaxially on the oxide thin layer 21; reference numeral 31 refers to a ferroelectric thin film of a perovskite-type oxide thin film grown epitaxially on the first signal electrode 22; reference numeral 23 refers to a second signal electrode formed on the ferroelectric thin film 31; and reference numeral 32 refers to a protective layer formed on the ferroelectric thin film 31 and the second signal electrode 23.

The peripheral circuitry 200 essentially comprises of a single crystal silicon substrate and integrated circuits formed on the single crystal silicon substrate.

The amorphous layer 201 can comprise $SiO_2$.

The amorphous layer 201 can be formed by a method such as a CVD method, a laser ablation method or the like. For example, when $SiO_2$ is formed by a laser ablation method, the oxygen partial pressure is set in 1.3 Pa ($1\times10^{-2}$ Torr) and the substrate temperature is set to between room temperature (20° C.) and 300° C. When forming AlN, $N_2$ is utilized.

The oxide thin layer 21 can be formed by SrO, MgO, $CeO_2$, $ZrO_2$, YSZ, BaO, CaO or the like. It is preferable that the thickness of each oxide thin layer be 1 to 50 nm. It is preferable that the thickness be more than 1 nm in order to grow a good perovskite-type oxide layer 22 epitaxially on the oxide thin layer. On the other hand, it is not necessary to have a thickness of more than 50 nm since the only requirement is that the perovskite-type oxide layer 22 be grown epitaxially on the oxide thin layer. The range of 1 to 5 nm is more preferable.

These oxide thin layers can be formed by a method such as a laser ablation method or the like. For example, when SrO is formed by a laser ablation method, the oxygen partial pressure is set to $1.3\times10^{-4}$ Pa ($1\times10^{-6}$ Torr) and the substrate temperature is set to 200° C. with an ion beam assisting the film formation.

The first signal electrode 22 of a perovskite-type oxide thin film can comprise $SrRuO_3$ or the like. The thickness of the perovskite-type oxide thin film 22 may be about 100 nm since it is only required to function as an electrode.

The oxide electrode layer 22 comprising perovskite-type oxide layers can be formed by a method such as a laser ablation method or the like. For example, when a laser ablation method is used, these perovskite-type oxide layers can be fabricated at a substrate temperature of 500 to 650° C. and an oxygen partial pressure of 1.3 Pa ($1\times10^{-2}$ Torr).

The ferroelectric thin film 31 of a perovskite-type oxide thin film can comprise $BaTiO_3$, PZT, $SrBi_2Ta_2O_9$, $Bi_4Ti_3O_{12}$ or the like. It is preferable that the thickness of these perovskite-type oxide thin film 31 be 10 to 200 nm.

These piezoelectric thin films of perovskite-type oxide layers can be formed by a method such as a laser ablation method, a CVD method, a sputtering method, a sol-gel processing or the like. For example, when BaTiO is used, the piezoelectric thin film can be formed at a substrate temperature of 500 to 650° C. and an oxygen partial pressure of 1.3 Pa ($1\times10^{-2}$ Torr).

The electrode 23 can comprise $SrRuO_3$, Pt, Ir, Al, Cu or the like.

These electrodes can be formed by a method such as a laser ablation method, a sputtering method, an evaporation method or the like.

The protective layer 32, formed on the ferroelectric thin film 31 and the second signal electrode 23, can comprise $SiO_2$.

These thin films of oxides or nitrides as protective layers can be formed by a method such as a laser ablation method, a CVD method or the like.

(Embodiment 3)

Figure 4:
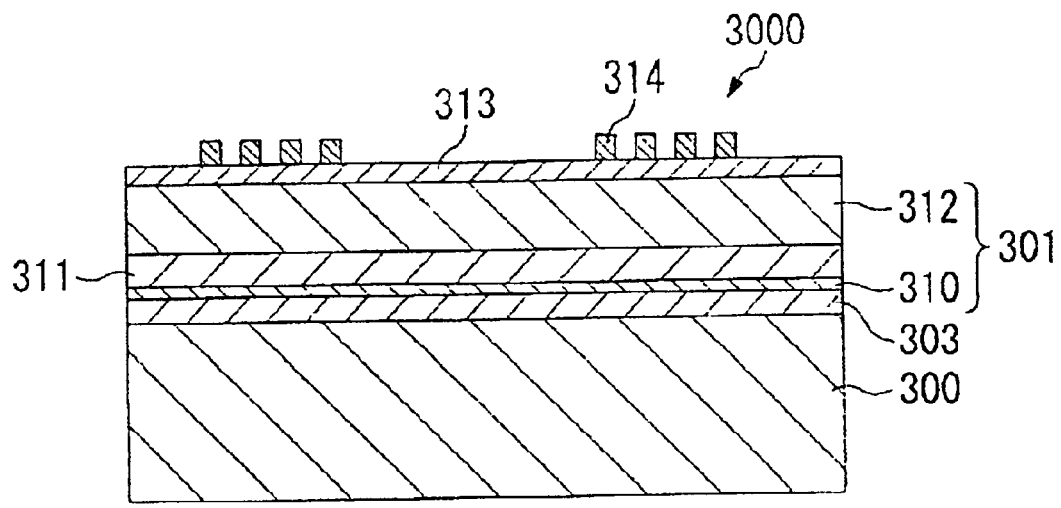
FIG. 4 is a schematic cross sectional view of a surface acoustic wave (SAW) oscillator in Embodiment 3 of the present invention.

FIG. 4 is a schematic cross sectional view of a surface acoustic wave (described as SAW hereafter) oscillator 3 in Embodiment 3 of the present invention. The SAW oscillator comprises an oscillation circuit 300 including MOS transistors and a SAW resonator 301. The top end of the oscillation circuit 300 is an amorphous layer 303 of an interlayer insulating film acting as a protective layer at the same time. The reference numeral 310; refers to an oxide thin layer formed on this amorphous layer 303; reference numeral 311 refers to a perovskite-type oxide thin film grown epitaxially on the oxide thin layer 310; reference numeral 312 refers to a perovskite-type oxide piezoelectric thin film grown epitaxially on the perovskite-type oxide thin film 311; reference numeral 313 refers to a thin film of a protective layer formed on the piezoelectric thin film 312; and reference numeral 314 refers to an electrode formed on the protective layer 313.

The oscillation circuit 300 essentially comprises a single crystal silicon substrate and integrated circuits formed on the single crystal silicon substrate.

The amorphous layer 303 can comprise $SiO_2$, AlN or the like.

This amorphous layer 303 can be formed by a method such as a laser ablation method, a CVD method or the like. For example, when $SiO_2$ is formed by a laser ablation method, the oxygen partial pressure is set to 1.3 Pa ($1\times10^{-2}$ Torr) and the substrate temperature is set to between room temperature (20° C.) and 300° C. When forming AlN, $N_2$ is utilized.

The oxide thin layer 310 can be formed by SrO, MgO, $CeO_2$, $ZrO_2$, YSZ, BaO, CaO or the like.

These oxide thin layers can be formed by a method such as a laser ablation method or the like. For example, when SrO is formed by a laser ablation method, the oxygen partial pressure is set to $1.3\times10^{-4}$ Pa ($1\times10^{-6}$ Torr) and the substrate temperature is set to 200° C. with an ion beam assisting the film formation.

The perovskite-type oxide thin film 311 can comprise $SrTiO_3$ or the like. This perovskite-type oxide thin film 311 is required for epitaxially growing a perovskite-type oxide piezoelectric thin film. It is preferable that the perovskite-type oxide thin film 311 be thicker in order to prevent leakage of electromagnetic waves and to increase the speed of sound waves.

This perovskite-type oxide thin film can be formed by a method such as a laser ablation method or the like. For example, the perovskite-type thin film can be formed by a laser ablation method with an oxygen partial pressure of 1.3 Pa ($1\times10^{-2}$ Torr) and a substrate temperature of 500 to 650° C.

The perovskite-type oxide piezoelectric thin film 312 can comprise $KNbO_3$, PZT, $BaTiO_3$ or the like. It is preferable that the thickness of the perovskite-type oxide piezoelectric thin film 312 be 1 $\mu$m or more because a high electromechanical coupling factor can be obtained.

The perovskite-type oxide piezoelectric thin film 312 can be formed by a method such as a laser ablation method, a CVD method, a sputtering method, a sol-gel processing or the like. For example, this thin film can be formed, in the case of the laser ablation method, with an oxygen partial pressure of 1.3 Pa ($1\times10^{-2}$ Torr) and a substrate temperature of 500 to 650° C.

The protective layer 313 formed on the perovskite-type oxide piezoelectric thin film 312 can comprise $SiO_2$, AlN or the like.

These thin films of oxides or nitrides as protective layers can be formed by a method such as a laser ablation method, a CVD method or the like. For example, when $SiO_2$ is formed by a laser ablation method, the oxygen partial pressure is set to 1.3 Pa ($1\times10^{-2}$ Torr) and the substrate temperature is set to between room temperature (20° C.) and 300° C.

The electrode 314 is an IDT electrode comprising Al, Cu, Al—Cu—Si alloy, $SrRuO_3$ or the like.

These electrodes can be formed by a sputtering method, a evaporation method, a laser ablation method or the like.
(Embodiment 4)

Figure 5:
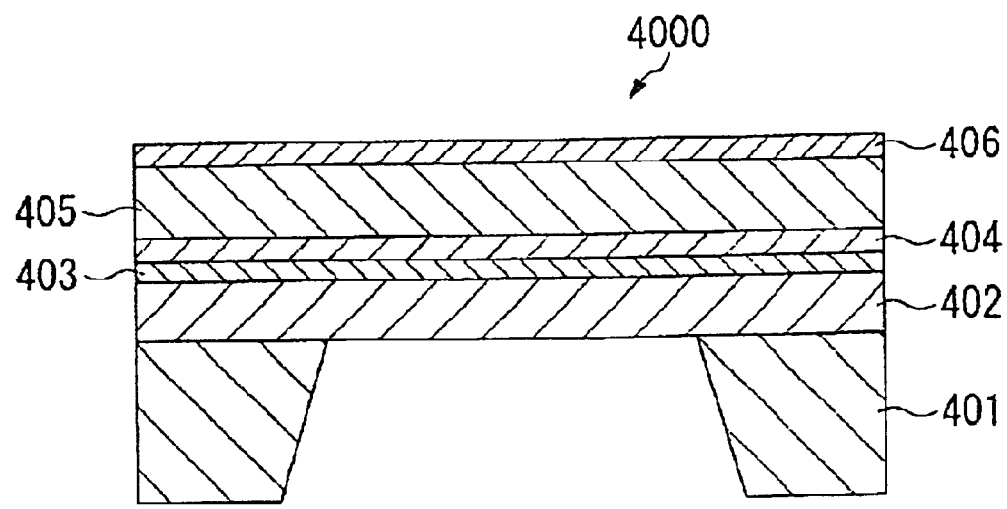
FIG. 5 is a schematic cross sectional view of a piezoelectric device in Embodiment 4 of the present invention.

FIG. 5 is a schematic cross sectional view of a piezoelectric device in Embodiment 4 of the present invention. In this drawing, the reference numeral 401 refers to a substrate; reference numeral 402 refers to an inorganic amorphous layer formed on the substrate 401; reference numeral 403 refers to an oxide layer formed on the inorganic amorphous layer 402; reference numeral 404 refers to a perovskite-type oxide layer as a lower electrode grown epitaxially on the oxide layer 403; reference numeral 405 refers to a perovskite-type oxide piezoelectric thin layer grown epitaxially on the lower electrode 404; and reference numeral 406 refers to an upper electrode formed on the piezoelectric thin layer 405.

The substrate 401 comprises a silicon single crystal.

The amorphous layer 402 can comprise $SiO_2$ or the like.

These amorphous layers 402 can be formed by a method such as thermal oxidation, a CVD method, a laser ablation method or the like.

The oxide thin layer 403 can be formed by SrO, MgO, $CeO_2$, $ZrO_2$, YSZ, BaO, CaO or the like.

These oxide thin layers can be formed by a method such as a laser ablation method, a CVD method or the like. For example, when SrO is formed, the oxygen partial pressure is set to $1.3\times10^{-4}$ Pa ($1\times10^{-6}$ Torr) and the substrate temperature is set to 200° C. with an ion beam assisting the film formation.

The perovskite-type oxide thin film 404 as the lower electrode can comprise $SrRuO_3$, $SrTiO_3$ made conductive by adding dopants such as Nb, or the like.

These perovskite-type oxide thin films as the lower electrodes can be formed by a method such as a laser ablation method, a CVD method, a sputtering method, a sol-gel processing or the like. For example, the thin film can be formed with an oxygen partial pressure of 1.3 Pa ($1\times10^{-2}$ Torr) and a substrate temperature of 500 to 650° C.

The perovskite-type oxide piezoelectric thin film 405 can comprise $BaTiO_3$, PZT, $SrBi_2Ta_2O_9$, $Bi_4Ti_3O_{12}$ or the like.

The perovskite-type oxide piezoelectric thin film 405 can be formed by a method such as a laser ablation method, a CVD method, a sputtering method, a sol-gel processing, or the like.

The upper electrode 406 can comprise Al, Pt, Ir, perovskite-type oxides such as $SrRuO_3$, or the like.

These electrodes can be formed by a method such as a sputtering method, an evaporation method, a laser ablation method, a sol-gel processing or the like.

Next, electronic apparatuses having a ferroelectric memory device of Embodiment 2 will be explained.
(Embodiment 5)

Figure 6A:
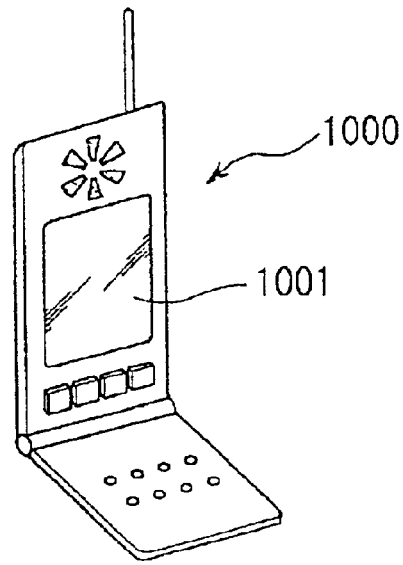
FIGS. 6A, 6B and 6C are perspective views showing embodiments of electronic apparatuses of the present invention containing a ferroelectric memory device provided with an electronic device of the present invention, where 6A shows a mobile phone, 6B shows a wristwatch type electronic apparatus, and 6C shows a mobile information processing device.

FIG. 6A is a perspective view of an example of a cellular phone. In FIG. 6A, reference numeral 1000 refers to a main unit of the cellular phone having a memory section 1001 containing the ferroelectric memory device.
(Embodiment 6)

Figure 6B:
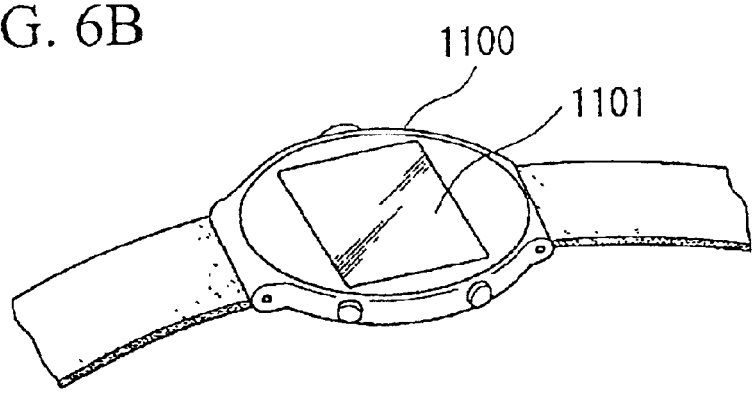

FIG. 6B is a perspective view of an example of a wrist watch type electronic apparatus. In FIG. 6B, reference numeral 1100 refers to a main unit of the watch having a memory section 1101 containing the ferroelectric memory device.
(Embodiment 7)

Figure 6C:
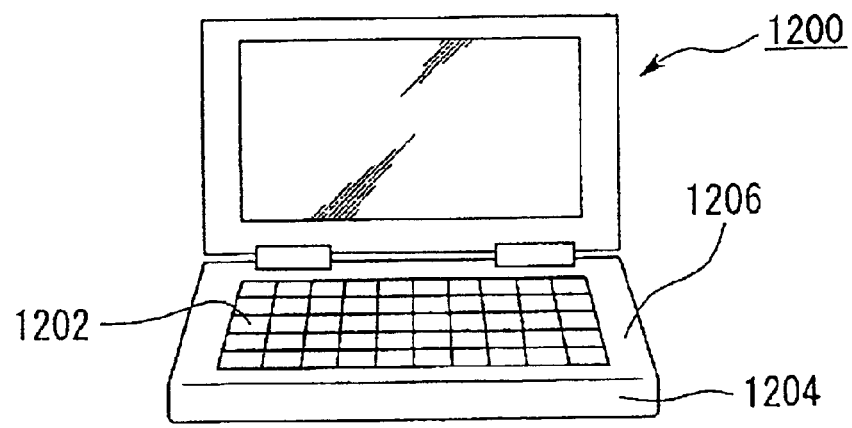

FIG. 6C is a perspective view of a mobile information processing device such as a word processor or a personal computer, for example. In FIG. 6C, the reference numeral 1200 refers to an information processing device; the reference numeral 1202 refers to an input section such as a keyboard; and the reference numeral 1204 refers to a main unit of the information processing device having a memory section 1206 containing the ferroelectric memory device.

Also, as an example of other electronic apparatuses, even though not shown, the present invention can be applied to a so-called IC card having a memory section containing the ferroelectric memory device.

Each electronic apparatus (including an IC card) shown in FIGS. 6A to 6C contains a ferroelectric memory device according to the embodiments described above, and thereby a compact electronic apparatus having a high reliability can be realized.

The technological scope of the present invention is not limited to the embodiments described above and various modifications can be added within the scope of the gist of the present invention.

For example, the above ferroelectric memory device can be applied to a so-called 1T1C type memory cell configured by one MOS transistor and one capacitor, or a so-called 2T2C type memory cell configured by two MOS transistors and two capacitors.

The present invention is explained in detail in the following examples.

EXAMPLE 1

FIG. 1 is a cross sectional view of a surface acoustic device 10 in Example 1 of the present invention. The device 10 is comprised of a substrate 1, an amorphous layer 2, an oxide thin layer 3, an oxide thin layer 4, a piezoelectric thin film 5, a thin film 6 of an oxide or a nitride as a protective layer, and an electrode 7.

Fabrication processing of the surface acoustic device having the configuration above of the present invention is specifically described. A silicon substrate, on which a polycrystalline diamond thin film of thickness of 20 μm is formed, is used as a substrate 1. First, a $SiO_2$ amorphous layer 2 is formed on the substrate 1 by using a laser ablation method. Next, a $CeO_2$ thin film as an oxide thin layer 3 is formed similarly on the amorphous layer 2 by using a laser ablation method with an ion beam assist. With an oxygen plasma of 0.13 Pa ($10^{-4}$ Torr) and a substrate temperature of 500° C., a $CeO_2$ thin film of (100) orientation was formed. By examining in-plane orientation of the $CeO_2$ thin film obtained through an X-ray diffraction pole figure, it was verified that the film has an in-plane orientation as well. That is, it was verified that a $CeO_2$ thin film of (100) orientation was grown epitaxially on the $SiO_2$ amorphous layer 2.

Again, a $SrTiO_3$ thin film as an oxide thin layer 4 was formed similarly on the $CeO_2$ oxide thin layer 3 by a laser ablation method. Multiple targets can be loaded in the laser ablation device and several films of different materials can be formed consecutively in the same chamber. After a film was formed in the oxygen plasma of 0.13 Pa ($10^{-4}$ Torr) at a substrate temperature of 600° C., it was verified that a perovskite-type oxide $SrTiO_3$ thin film of (110) orientation was grown epitaxially on the $CeO_2$ thin film of (100) orientation. This orientation relationship seems to be due to the relationship of the crystal structure and the lattice constant between $CeO_2$ of the fluorite ($CaF_2$) structure and $SrTiO_3$ of the perovskite-type structure.

Next, a $KNbO_3$ piezoelectric thin film 5 was similarly formed consecutively in the same chamber by a laser ablation method. At this time, since K is easily evaporated, it is better to supply a high dosage of K for target formation. After a film was formed in the oxygen plasma of 0.013 Pa ($10^{-4}$ Torr) at the substrate temperature of 600° C., it was verified that a $KNbO_3$ thin film 5 of (010) orientation was grown epitaxially on the perovskite-type oxide $SrTiO_3$ thin film of (110) orientation. $SrTiO_3$ and $KNbO_3$ have the same perovskite-type structure, which orientation relationship was influenced by the lattice constant and was identical to the one described in the Japanese Unexamined Patent Application, First Publication No. Hei 10-65488.

As described above, by forming a $SiO_2$ amorphous layer 2 on a substrate 1 having a polycrystalline diamond thin film with a thickness of 20 μm formed on the silicon substrate, a (100) orientation $CeO_2$ thin film as an oxide thin layer 3 and a (110) orientation $SrTiO_3$ thin film as an oxide thin layer 4 were grown epitaxially, and by making the $SrTiO_3$ thin film in (110) orientation, a $KNbO_3$ thin film was grown epitaxially on the $SrTiO_3$ thin film in (010) orientation. The <010> direction of $KNbO_3$ is the direction of the polarization axis.

When a $CeO_2$ thin film was formed on the substrate 1 directly without having a $SiO_2$ amorphous layer 2, a $CeO_2$ thin film, a $SrTiO_3$ thin film and a $KNbO_3$ thin film all became polycrystalline thin films due to lattice mismatch; therefore, desired characteristics could not be obtained, as will be described later. Also, when a $KNbO_3$ thin film was formed on the substrate 1 directly, the $KNbO_3$ thin film became a polycrystal thin film due to lattice mismatch; therefore, desired characteristics could not be obtained, as will be described later.

Consequently, with the configuration described above, a high quality $KNbO_3$ piezoelectric thin film 5 was successfully grown epitaxially for the first time.

Furthermore, here, even though silicon oxide was used as an amorphous layer, the same effect could be obtained by using AlN.

Even though a $CeO_2$ thin film was used as an oxide thin layer 3, the same effect could be obtained by using a $ZrO_2$ thin film or a YSZ thin film.

When SrO, GaO, BaO or MgO is used for an oxide thin layer 3, each epitaxial thin film is formed in (100) orientation for SrO, MgO or the like, in (100) orientation for an oxide thin layer 4 ($SrTiO_3$ thin film) grown on the oxide thin layer 3, in (001) orientation for a piezoelectric thin film 5 ($KNbO_3$ thin film) grown on the oxide thin layer 4; therefore, orientations which differ from the configuration above can be obtained as well.

Next, a $SiO_2$ amorphous thin film as the thin film 6 of a protective layer comprised of an oxide or a nitride is formed similarly on the $KNbO_3$ thin film 5 consecutively in the same chamber by using a laser ablation method. Since K in $KNbO_3$ is prone to react with water and deteriorates over time, a protective layer 6 is required. Since the sign of the temperature coefficient of $SiO_2$ is opposite to that of $KNbO_3$, the protective layer also plays a role in controlling the temperature characteristics. One of the materials playing the same role as $SiO_2$ is AlN; therefore, an AlN thin film may be used as a protective layer.

Finally, a surface acoustic device as shown in FIG. 1 is fabricated by forming an aluminum thin film on the $SiO_2$ and by forming an IDT electrode 7 by the use of patterning.

The reason for using a silicon substrate, having a polycrystalline diamond thin film formed thereon as a substrate 1 is that the diamond is the material having the highest sound velocity among known materials and is most suitable for high frequencies in the GHz band which will be required for the surface acoustic devices in the future. On the other hand, the reason for using $KNbO_3$ as a piezoelectric thin film 5 is that high performance can be expected since it has a high electromechanical coupling factor ($k^2$) of 50% or higher.

Evaluation on the characteristics of the surface acoustic wave (SAW hereafter) device fabricated showed that a value for $k^2$ of 10% or higher was obtained with a good repeatability. However, since the $k^2$ value depends on the quality and film thickness of the $KNbO_3$ thin film 5, a film forming technique to obtain high quality film is required for the $KNbO_3$ thin film 5 as well as the oxide thin layers 3 and 4; furthermore, the film thickness must be correct. Regarding sound speed, it was verified that the substrate caused excitation of Sezawa waves with a high sound velocity of over 10000 m/s. That is, obtaining high frequency in the GHz band can be achieved by normal photolithographic processing.

As a comparison, $k^2$ of approximately 1% was obtained for a test sample forming a $CeO_2$ thin film on a substrate 1 directly without having a $SiO_2$ amorphous layer 2, and for another test sample forming a $KNbO_3$ thin film directly on a substrate 1. The results were considerably inferior to the results obtained in the epitaxially grown layer.

Even though a silicon substrate, having a polycrystalline diamond thin film formed thereon, is used as a substrate 1 in Example 1, the substrate may be any material as long as the material can withstand the substrate temperature where oxide layers 3 and 4, and the piezoelectric thin film 5, are grown epitaxially, and satisfies the sound velocity requirement. Also, even though $KNbO_3$ was used as a piezoelectric thin film 5, it is not necessary to be limited to this material. The materials for each thin film, fabrication methods and fabrication conditions are also not limited to these.

EXAMPLE 2

FIG. 2 is a schematic plan view of a ferroelectric memory device (a type of electronic device of the present invention) in Example 2 of the present invention. FIG. 3 is a partial schematic cross sectional view along A—A of FIG. 2

The ferroelectric memory devices of the Example 2 of the present invention having a matrix type memory cell array 100 with superior integration have a structure of forming the memory cell array 100 on a peripheral circuitry 200 containing MOS transistors for selecting a memory cell. The peripheral circuitry 200 contains various circuits in order to write or read data selectively from or to a memory cell. As shown in FIG. 3, the memory cell array 100 was formed on and in contact with the peripheral circuitry 200. Here, the top section of the peripheral circuitry 200 was a $SiO_2$ amorphous layer of an interlayer insulating film acting as a protective layer at the same time. Consequently, the memory cell array 100 must be formed on the $SiO_2$ amorphous layer; however, since a superior square-loop P-V characteristic is required for a ferroelectric memory device using a memory cell array, a ferroelectric thin film 31 must be grown epitaxially. Furthermore, in FIG. 2, the ferroelectric thin film 31 is placed between a first signal electrode 22 and a second signal electrode 23.

Specific fabrication processes for the memory array 100 are described by referring to FIG. 3. First, a SrO thin film as an oxide thin layer 21 was formed on the peripheral circuitry 200 having the uppermost section terminated by a $SiO_2$ amorphous layer by using a laser ablation method with an ion beam assist. At this time, it was verified through X-ray diffraction that SrO was an epitaxial thin film of (100) orientation. Next, a $SrRuO_3$ thin film of a conductive perovskite-type oxide was formed as the first signal electrode 22 by using a laser ablation method. As expected, it was verified that $SrRuO_3$ was also an epitaxial thin film with pseudo-cubic crystal (100) orientation.

Next, as shown in FIG. 2, a prescribed shape of $SrRuO_3$ was obtained by patterning, and then $BaTiO_3$ was formed as the ferroelectric thin film 31 by using a laser ablation method. Here, it was verified that $BaTiO_3$ on $SrRuO_3$ was an epitaxial thin film of (001) orientation. Then, similarly to the first signal electrode 22, $SrRuO_3$ was formed, and then a prescribed shape was obtained by patterning to form the second signal electrode 23. Finally, a protective layer 32 comprised of an insulating film of, for example, $SiO_2$, AlN or the like was formed on the ferroelectric thin film 31, on which the second signal electrode 23 had been formed.

Even though a configuration of placing a memory array and a peripheral circuitry on separate planets can be used, the configuration of the Example 2 of the present invention is superior in integration of high capacity memory cells.

Here, an example of write and read operation for a memory cell is described. First, a read out voltage $V_O$ is applied to a selected cell during a read-operation. This operation also performs a write-operation of "0" at the same time. At this time, a current flowing in the selected bit lines or a potential when the bit lines are placed in a high impedance state is read out by a sense amplifier. Also, at this time, a prescribed voltage is applied to unselected cells in order to prevent cross talk during the read operation. When "1" is written during a write operation, a voltage of $V_O$ is applied to a selected cell. When "0" is written, a voltage not inverting the polarization of the selected cell is applied and the "0" state written during the read operation is held. At this time, a prescribed voltage is applied to the capacitors of unselected cells in order to prevent cross talk during the write operation.

Furthermore, the materials, fabrication methods and fabrication processing used here are also not limited to those described. Even though silicon oxide ($SiO_2$) was used as an amorphous layer here, the same effect can be obtained by using AlN and glass.

Even though a SrO thin film was used as an oxide thin layer 3, the same effect can be obtained by using a $CeO_2$ thin film, a $ZrO_2$ thin film, a MgO thin film, a CaO thin film, a BaO thin film or a YSZ thin film.

EXAMPLE 3

FIG. 4 is a schematic cross sectional view of a SAW oscillator in Example 3 of the present invention. The SAW oscillator comprises an oscillation circuit 300 and a SAW resonator 301. The reference numeral 310 refers to an oxide thin layer; reference numeral 311 refers to a perovskite-type oxide; reference numeral 312 refers to a piezoelectric thin film; reference numeral 313 refers to a thin film as a protective layer; and reference numeral 314 refers to an electrode. The uppermost section of the oscillation circuit 300 is a $SiO_2$ amorphous layer 303 of an interlayer insulating film acting as a protective layer at the same time. Consequently, the SAW resonator 301 must be formed on the $SiO_2$ amorphous layer 303; however, a piezoelectric thin film 312 must be grown epitaxially in order to obtain a SAW resonator 301 having good performance.

The fabrication process of the SAW resonator 301 is described by referring to FIG. 4, which is similar to the one described in Example 1. First, a SrO thin film as the oxide layer 310 was formed on the oscillation circuit 300 having the uppermost section terminated by a $SiO_2$ amorphous layer 303. As described in Example 1, SrO was an epitaxial thin film of (100) orientation at this time. Then, a $SrTiO_3$ thin film of an oxide thin layer 311 was formed on the SrO oxide thin layer 310. The $SrTiO_3$ thin film of (100) orientation was grown epitaxially on the SrO thin film of (100) orientation. Next, a $KNbO_3$ piezoelectric thin film 312 was formed The $KNbO_3$ thin film 312 with (001) orientation was grown epitaxially on the $SrTiO_3$ thin film of (100) orientation. A thin film 313 of a protective layer comprised of an oxide or a nitride was formed on the $KNbO_3$ thin film 312. Finally, an aluminum thin film was formed on the protective layer 313, the electrode 314 was formed by patterning the layer 313, and the SAW oscillator shown in FIG. 4 was fabricated.

Evaluation on the characteristics of the SAW resonator 301 showed that a value of $k^2$ of 10% or higher was obtained with a good repeatability. However, the $k^2$ value depends on the quality and film thickness of the $KNbO_3$ thin film 312, a film forming technology to obtain high quality film is required for the $KNbO_3$ thin film as well as the oxide thin layers, 310 and 311, and the film thickness must be correct.

A SAW oscillator usually has a configuration of placing a SAW resonator and an oscillation circuit separately on the same plane within a package. A SAW oscillator which is extremely miniaturized and with higher performance compared to the conventional unit can be obtained by using the configuration of the present invention.

Furthermore, even though $KNbO_3$ was used as the piezoelectric thin film 312, this is not limited thereto.

EXAMPLE 4

FIG. 5 is a schematic cross sectional view of a piezoelectric device in Example 4 of the present invention. In this drawing, the reference numeral 401 refers to a single crystal substrate; reference numeral 402 refers to a $SiO_2$ amorphous layer; reference numeral 403 refers to an oxide layer; reference numeral 404 refers to a perovskite-type oxide layer as a lower electrode; reference numeral 405 refers to a perovskite-type oxide piezoelectric thin layer; and reference numeral 406 refers to an upper electrode. Specific fabrication processing is described by referring to FIG. 5.

First, a $SiO_2$ amorphous layer 402 is formed on the surface of Si (110) single crystal substrate 401 by using thermal oxidation. Next, a SrO oxide layer 403 is formed, and then a $SrRuO_3$ thin film of a perovskite-type oxide is formed as a lower electrode 404. Then, on top of that, $BaTiO_3$ as a piezoelectric thin film 405 and $SrRuO_3$ as an upper electrode 406 are formed consecutively. A cavity is formed at the rear side of the Si (110) single crystal substrate 40 by etching. At this time, the $SiO_2$ amorphous layer 402 plays a role of etching stopper. Consequently, a piezoelectric device as shown in FIG. 5 is formed. An actual result was that each of the SrO oxide layer of (100) orientation, the lower electrode $SrRuO_3$ with pseudo-cubic crystal (100) orientation, the piezoelectric thin film $BaTiO_3$ with (001) orientation, and the upper electrode $SrRuO_3$ with pseudo-cubic crystal (100) orientation was an epitaxial thin film.

Evaluation on the performance index of this element showed that the performance index ((piezoelectric constant)×(Young's modulus)) had an improvement of 50% compared with the case of using polycrystal $BaTiO_3$ piezoelectric thin film.

Furthermore, the materials for the lower electrode, the piezoelectric thin film and the upper electrode are not limited to the ones described above. Also, MgO, CaO or BaO may be used as an oxide layer 403 and when $CeO_2$, $ZrO_2$ or YSZ is used, the orientation of the piezoelectric thin film 405 can be changed, and thereby, the characteristics can be controlled.

Instead of a $SiO_2$ amorphous layer 402, an organic solid layer can be used. For example, an organic solid layer can be formed by applying a melamine resin layer or a polyimide precursor liquid on a substrate for hardening or by using nylon 66 or polyethylene terephthalate for thermobonding. Each of an oxide layer 403, a perovskite-type oxide thin film 404, a piezoelectric thin film 405, and an upper electrode 406 can be formed or grown by a laser ablation method at a substrate temperature of 200 to 350° C. with an ion beam assist.

The entire disclosures of Japanese Patent Nos. 2001-093924 filed Mar. 28, 2001, 2002-076695 filed Mar. 19, 2002, and 2002-085812 filed Mar. 26, 2002 are incorporated by reference.

What is claimed is:

1. An electronic device comprising:
   a single silicon crystal substrate;
   a polycrystalline diamond thin film on the single crystal substrate;
   an inorganic amorphous layer on the polycrystalline diamond thin film;
   an oxide thin layer on the inorganic amorphous layer;
   a perovskite-type oxide thin film grown epitaxially above the oxide thin layer; and
   a piezoelectric thin film comprising $KNbO_3$ above the perovskite-type oxide thin film.

2. The electronic device according to claim 1, wherein the inorganic amorphous layer comprises silicon oxide, and the oxide thin layer comprises at least one oxide selected from the group consisting of strontium oxide, barium oxide, calcium oxide, magnesium oxide, cerium oxide, zirconium oxide, and yttrium stabilized zirconium oxide.

3. An electronic apparatus comprising an electronic device according to claim 1.

4. The electronic device according to claim 1, wherein the oxide thin layer comprises $CeO_2$ with (100) orientation, the perovskite-type oxide thin film comprises $SrTiO_3$ with (110) orientation, and the piezoelectric thin film comprises $KNbO_3$ with (010) orientation.

5. The electronic device according to claim 1, wherein the oxide thin layer comprises at least one of SrO with (100) orientation, MgO with (100) orientation, CaO with (100) orientation and BaO with (100) orientation, the perovskite-type oxide thin film comprises $SrTiO_3$ with (100) orientation, and the piezoelectric thin film comprises $KNO_3$ with (001) orientation.

6. The electronic device according to claim 1, wherein the perovskite-type oxide thin film comprises one of $SrTiO_3$ and $SrRuO_3$.

7. The electronic device according to claim 1, wherein the piezoelectric thin film comprises $KNbO_3$ with (010) orientation or with (001) orientation.

8. The electronic device according to claim 1, wherein the oxide thin layer comprises at least one of strontium oxide, barium oxide, calcium oxide, magnesium oxide, cerium oxide, zirconium oxide, and yttrium stabilized zirconium oxide.

9. An electronic apparatus comprising an electronic device according to claim 8.

10. An electronic apparatus comprising an electronic device according to claim 2.

11. An electronic device comprising:
    an inorganic amorphous layer;
    an oxide thin layer on the inorganic amorphous layer; and
    a perovskite-type oxide thin film grown epitaxially and comprising $SrRuO_3$ with pseudo-cubic crystal (100) orientation above the oxide thin layer.

12. The electronic device according to claim 11, wherein the oxide thin layer comprises at least one of strontium oxide, barium oxide, calcium oxide, magnesium oxide, cerium oxide, zirconium oxide, and yttrium stabilized zirconium oxide.

13. An electronic apparatus comprising an electronic device according to claim 11.

14. The electronic device according to claim 11, further comprising a Si (110) single crystal substrate, and the inorganic amorphous layer being formed in direct contact with the Si (110) single crystal substrate.

15. The electronic device according to claim 11, further comprising a piezoelectric thin film above the perovskite-type oxide thin film.

16. The electronic device according to claim 15, wherein the piezoelectric thin film comprises one of $BaTiO_3$, PZT, $SrBi_2Ta_2O_9$ and $Bi_4Ti_3O_{12}$.

17. An electronic device comprising:
    an inorganic amorphous layer;
    an oxide thin layer comprising SrO with (100) orientation on the inorganic amorphous layer;

a perovskite-type oxide thin film comprising $SrTiO_3$ with (100) orientation grown epitaxially above the oxide thin layer; and a piezoelectric thin film comprising KNbO3 with (001) orientation above the perovskite-type oxide thin film.

18. An electronic device comprising:

an inorganic amorphous layer;

an oxide thin layer on the inorganic amorphous layer;

a perovskite-type oxide thin film comprising $SrRuO_3$ which has been grown epitaxially above the oxide thin layer; and a piezoelectric thin film comprising PZT above the perovskite-type oxide thin film.

19. The electronic device according to claim 18, wherein the perovskite-type oxide thin film comprising $SrRuO_3$ grown epitaxially has pseudo-cubic crystal (100) orientation.

20. The electronic device according to claim 18, further comprising a Si (110) single crystal substrate, the inorganic amorphous layer is formed in direct contact with the Si (110) single crystal substrate.

* * * * *